United States Patent [19]
Hayes

[11] Patent Number: 5,954,877
[45] Date of Patent: Sep. 21, 1999

[54] SOFT IMPACT DISPENSE NOZZLE

[75] Inventor: Bruce L. Hayes, Boise, Id.

[73] Assignee: Micron Technology, Inc., Boise, Id.

[21] Appl. No.: 08/823,815

[22] Filed: Mar. 24, 1997

[51] Int. Cl.[6] .............................. B05B 13/02; B05B 1/26
[52] U.S. Cl. ............................ 118/319; 118/52; 118/300; 239/518
[58] Field of Search ..................................... 239/518, 520, 239/524, 553.3, 553.5; 118/52, 319, 320, 300; 222/478

[56] References Cited

U.S. PATENT DOCUMENTS

| | | | |
|---|---|---|---|
| 3,785,572 | 1/1974 | Arnold et al. | 239/518 |
| 3,811,621 | 5/1974 | Augustine | 239/520 |
| 3,825,188 | 7/1974 | Doering | 239/520 |
| 3,831,861 | 8/1974 | Hanson, Jr. | 239/520 |
| 4,932,591 | 6/1990 | Cruz | 239/518 |
| 5,002,008 | 3/1991 | Ushijima et al. . | |
| 5,020,200 | 6/1991 | Mimasaka et al. . | |
| 5,405,813 | 4/1995 | Rodrigues . | |
| 5,429,912 | 7/1995 | Neoh . | |

*Primary Examiner*—David A. Simmons
*Assistant Examiner*—Calvin Padgett
*Attorney, Agent, or Firm*—Kirkpatrick & Lockhart LLP

[57] ABSTRACT

An apparatus and a method of dispensing process liquid from a liquid source onto a surface of a semiconductor wafer is disclosed in accordance with the present invention. The apparatus includes a nozzle having a bore with a longitudinal axis in fluid communication with the liquid source and a flow surface having a perimeter. The flow surface is oriented at a first angle relative to the axis and in fluid communication with the bore to dispense a sheet of process liquid from the perimeter onto a wafer surface. In a preferred embodiment, the nozzle is axisymmetric and includes a housing having a source portion connected to the liquid source and a dispense portion, and the bore traverses the source and dispense portions. An insert is provided having a first section disposed in the dispense portion of the bore adjacent to the source portion and a second section including the flow surface which is fully circumferential and continuous. The flow surface is in close proximity to the dispense portion, so as to define a flow path along the flow surface to control the flow of the process liquid. In the method of the invention, the nozzle is positioned to dispense a sheet of process liquid onto the wafer surface, while the surface is being rotated. The nozzle is radially offset from the center of the surface such that a portion of the continuous sheet of process liquid is dispensed directly onto the center of the wafer surface.

25 Claims, 9 Drawing Sheets

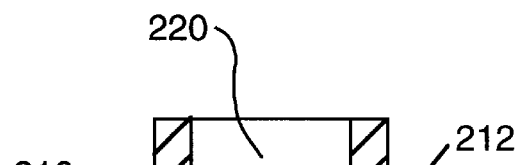
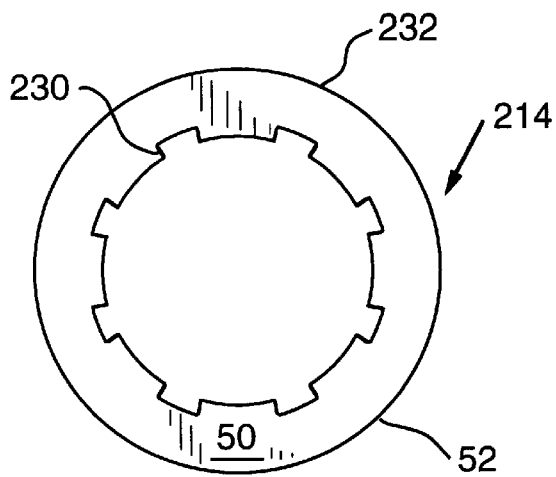
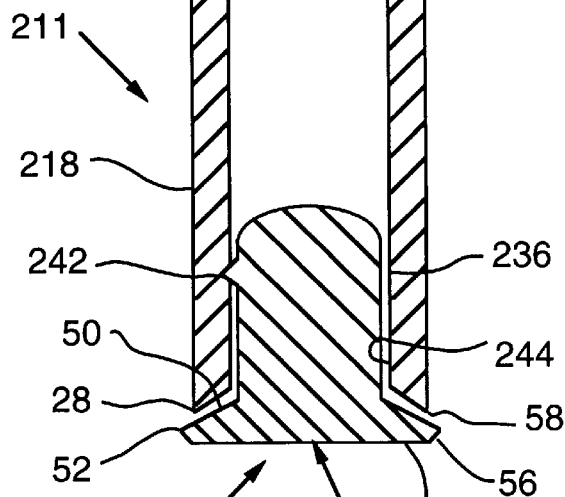
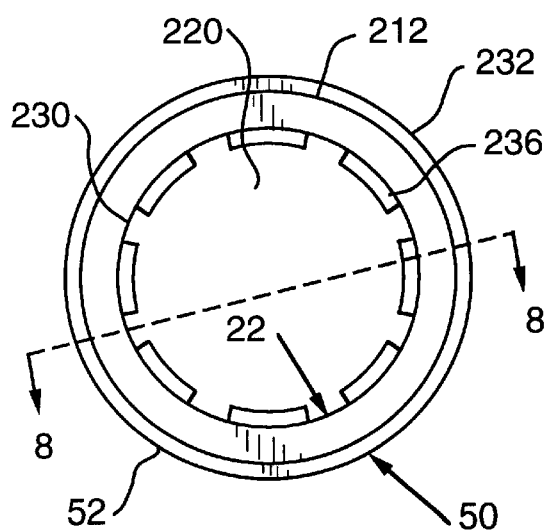

SOFT IMPACT DISPENSE NOZZLE

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention generally relates to a nozzle and a method for dispensing process liquids onto a surface. More particularly, the present invention relates to a fluid dispense nozzle and method for dispensing developer chemicals onto a rotating semiconductor substrate material.

Integrated circuits are typically constructed by depositing a series of individual layers of predetermined materials on a wafer shaped semiconductor substrate, or "wafer". The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist.

Photoresist materials are generally composed of a mixture of organic resins, sensitizers and solvents. Sensitizers are compounds, such as diazonaphthaquinones, that undergo a chemical change upon exposure to radiant energy, such as visible and ultraviolet light resulting in an irradiated material having differing solvation characteristics with respect to various solvents than the nonirradiated material. Resins are used to provide mechanical strength to the photoresist and the solvents serve to lower the viscosity of the photoresist so that it can be uniformly applied to the surface of the wafers.

After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a chemical, known as developer, in which either the irradiated or the nonirradiated photoresist is soluble and the photoresist is removed in the pattern defined by the mask, selectively exposing portions of the underlying insulating layer.

The exposed portions of the insulating layer are then selectively removed using an etchant to expose corresponding sections of the underlying circuit layer. The photoresist must be resistant to the etchant, so as to limit the attack of the etchant to only the exposed portions of the insulating layer.

Alternatively, the exposed underlying layer(s) may be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Developer solution and other process liquids are typically applied to the wafer using a spin coating technique in which the process liquid is sprayed on the surface of the wafer as the wafer is spun on a rotating chuck. The spinning of the wafer distributes the liquid over the surface of the material. When developer chemicals are applied to the surface, it is necessary to quickly and gently produce a deep puddle of developer on the wafer to ensure that the photoresist layer is dissolved uniformly in areas that are soluble in the developer.

A common practice in the prior art is to spray the process liquid onto the surface of the wafer from a source positioned high enough above the wafer to ensure that the spray fully covers the wafer. However, the process liquid develops a significant amount of momentum prior to contacting the surface that greatly disturbs the surface of photoresist material. Although the surface of the wafer is very smooth, the impact of the process liquid being dispensed onto the wafer results in a nonuniform distribution of the process liquid. In the case of applying developer solution, the turbulence caused by the impact of the developer increases the possibility that air bubbles will form in the developer and that uneven salvation of the photoresist will occur due to agitation caused by local mixing. Both of these problems decrease the uniformity and contribute to defects which reduce the overall yield of properly performing chips from the wafer.

Several attempts have been made in the prior art to minimize the aforementioned problems, such as disclosed in U.S. Pat. Nos. 5,002,008 issued to Ushijima et al., 5,020,200 issued to Mimasaka et al. and 5,429,912 issued to Neoh. The Ushijima patent discloses a nozzle having a trumpet shaped tip to prevent inadvertent dripping of the process material onto the wafer and threaded to the dispense arm to minimize the leakage of air into the nozzle itself. The nozzle is positioned in close proximity to the wafer and dispenses the process material perpendicular to the surface. The process material is distributed over the surface of the wafer by the spinning motion of the wafer on the chuck.

The Neoh patent discloses a nozzle apparatus that contains a well immediately upstream of the dispense end of the nozzle. The well provides a large flow area that slows the flow of the process material, allowing air pockets that may have been formed during the pumping of the material to the well to separate from the process material as a result of buoyancy and be removed from the nozzle. As with the Ushijima patent, the nozzle is positioned in close proximity to the wafer and dispenses the process material perpendicular to the surface. The process material is distributed over the surface of the wafer by the spinning motion of the wafer on the chuck. While the Ushijima and Neoh patents disclose nozzles that provide the aforementioned improvements, the process material is dispensed perpendicular to the surface in a small area proximate to the nozzle, which can cause nonuniformities in the surface of the coating layer due to the impact of the material as discussed previously.

The Mimasaka patent discloses a cylindrically shaped nozzle that contains a plurality of holes through the side of the nozzle in a direction parallel to the surface of the wafer. The nozzle produces a lower impact velocity of the process material by forcing the flow, which initially is perpendicular to the surface of the wafer to turn 180° after encountering blockage at the bottom of the nozzle and to exit the nozzle through holes in the side of the nozzle. The impact velocity of the process material is substantially lowered because the fluid has lost almost all of its momentum perpendicular to the wafer when it encountered the blockage in the nozzle; therefore only the gravitational acceleration of the fluid over the short distance from the holes in the nozzle to the surface of the wafer will contribute to the perpendicular component of the impact velocity.

Certain difficulties exist with the use of the Mimasaka nozzle. For instance, because the flow does not exit from the bottom of the nozzle, the nozzle must be positioned off the centerline of the wafer so that the flow exiting the holes contacts the center of the spinning wafer. The off-centerline positioning of the nozzle is not necessarily a less favorable orientation; however, the placement of the Mimasaka nozzle requires far more precision than the bottom dispense nozzles of the prior art. Both the bottom dispense and the Mimasaka nozzles have to be radially positioned over the centerline of the wafer to ensure full coverage requiring accuracy in the positioning of the nozzle on a scale of the liquid stream dimensions. The Mimasaka nozzle, however, must additionally be angularly positioned so that one hole on the circumference of the nozzle is aligned with the centerline of the wafer, while maintaining the proper radial alignment. The additional complexity of the alignment procedure was apparently recognized in the Mimasaka patent as an alternative embodiment also provides holes in the bottom of the nozzle. This embodiment, however, is fraught with the same problems as other prior art designs in which the fluid exits perpendicular to the surface of the wafer. Also, the use of a plurality of holes increases the potential for the liquid to drip onto the surface of the wafer after dispensing is completed, because the holes can act as vents and drains for the flow that facilitates the formation of drops.

In addition, because the flow generally must turn 180° and must exit through flow holes the flow path is necessarily extremely tortuous. In fact, the tortuous path is the means by which the Mimasaka nozzle lowers the impact velocity of the process material. The tortuosity of the flow path produces turbulence in the flow, even at low Reynolds numbers, which greatly increases the possibility that air will get trapped in the process material and that chaotic motion of the flow will disrupt the coating layer.

Thus, it is apparent that a need exists for an improved nozzle for spin dispensing apparatuses which overcomes, among others, the above-discussed problems so as to produce a more uniform layer of process liquid over the surface of the wafer.

BRIEF SUMMARY OF THE INVENTION

The above objects and others are accomplished by an apparatus and method for dispensing process liquid from a liquid source onto a surface of a semiconductor wafer in accordance with the present invention. The apparatus includes a nozzle having a bore with a longitudinal axis in fluid communication with the liquid source and a flow surface having a perimeter. The flow surface is oriented at a first angle relative to the axis and in fluid communication with the bore to dispense a sheet of process liquid from the perimeter onto a wafer surface. In a preferred embodiment, the nozzle is axisymmetric and includes a housing having a source portion connected to the liquid source and a dispense portion, and the bore traverses the source and dispense portions. An insert is provided having a first section disposed in the dispense portion of the bore adjacent to said source portion and a second section including the flow surface which is fully circumferential and continuous. The flow surface is in close proximity to the dispense portion, so as to define a flow path along the flow surface to control the flow of the process liquid. In the method of the invention, the nozzle is positioned to dispense a fully circumferential continuous sheet of process liquid onto the wafer surface, while the surface is being rotated. The nozzle is radially offset from the center of the surface such that a portion of the continuous sheet of process liquid is dispensed directly onto the center of the wafer surface.

Accordingly, the present invention provides an improved nozzle that allows process liquid to be dispensed more uniformly on a rotating surface, which provides for a more uniform distribution of the process liquid on the surface of the layer, while requiring less process liquid and slower rotational speed to ensure full coverage of the surface. These and other details, objects, and advantages of the invention will become apparent as the following detailed description of the present preferred embodiment thereof proceeds.

BRIEF DESCRIPTION OF THE DRAWINGS

Preferred embodiments of the present invention will be described in greater detail with reference to the accompanying drawings, wherein like members bear like reference numerals and wherein:

FIG. 6 is a top plan view of a second alternative embodiment of the insert;

FIG. 7 is a top plan view of a second alternative embodiment of the apparatus;

FIG. 8 is a side cross sectional assembled view of a second alternative embodiment of the apparatus along line 8—8;

DETAILED DESCRIPTION OF THE INVENTION

The operation of the apparatus 10 will be described generally with reference to the drawings for the purpose of illustrating present preferred embodiments of the invention only and not for purposes of limiting the same. The apparatus 10 of the present invention includes a nozzle 11 having a housing 12 attached to an insert 14 for use in dispensing a process liquid from a liquid source onto, for example, a rotating surface of a semiconductor wafer.

Figure 1:
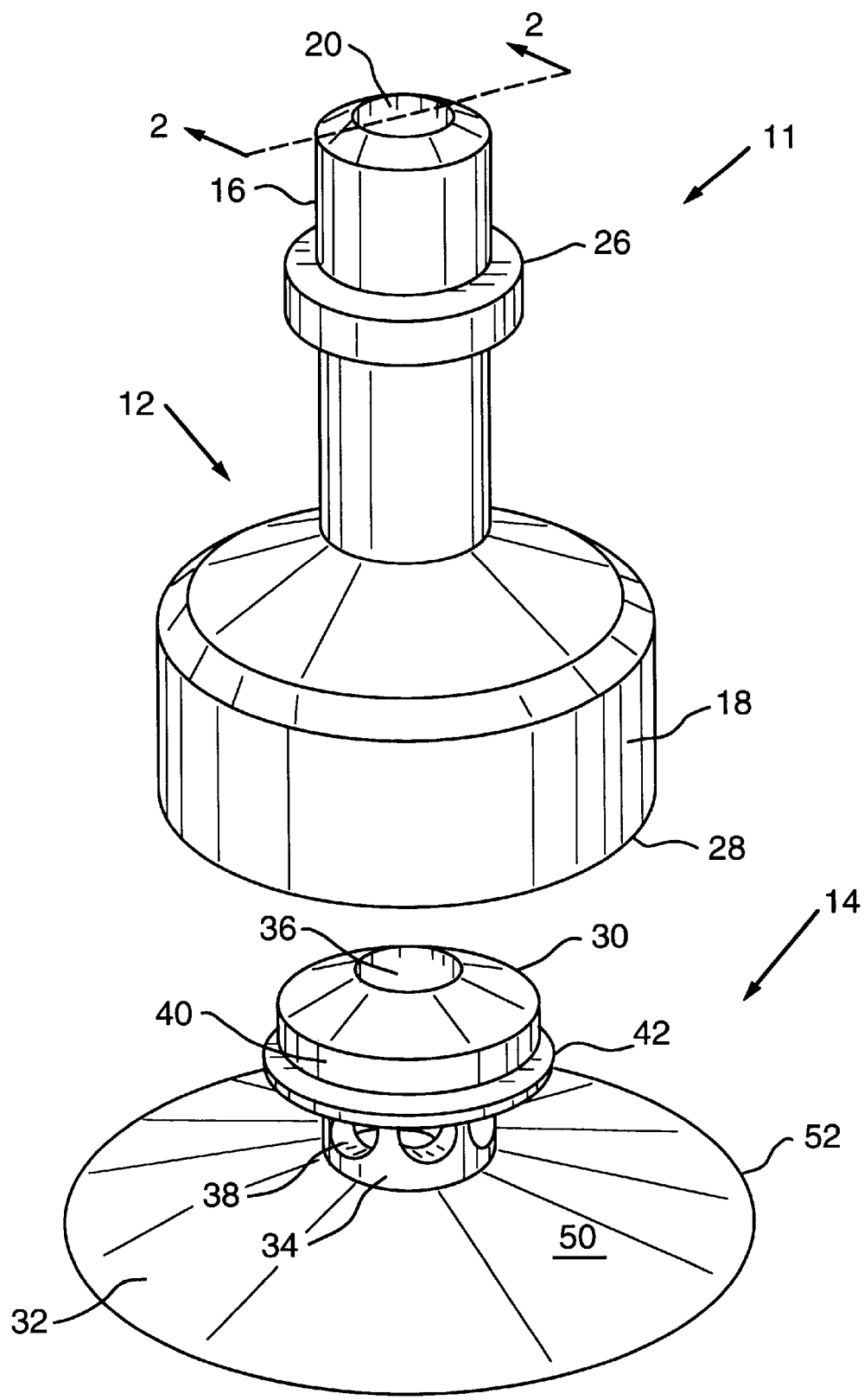
FIG. 1 is an exploded perspective view of a preferred embodiment of the present invention.
Figure 2:
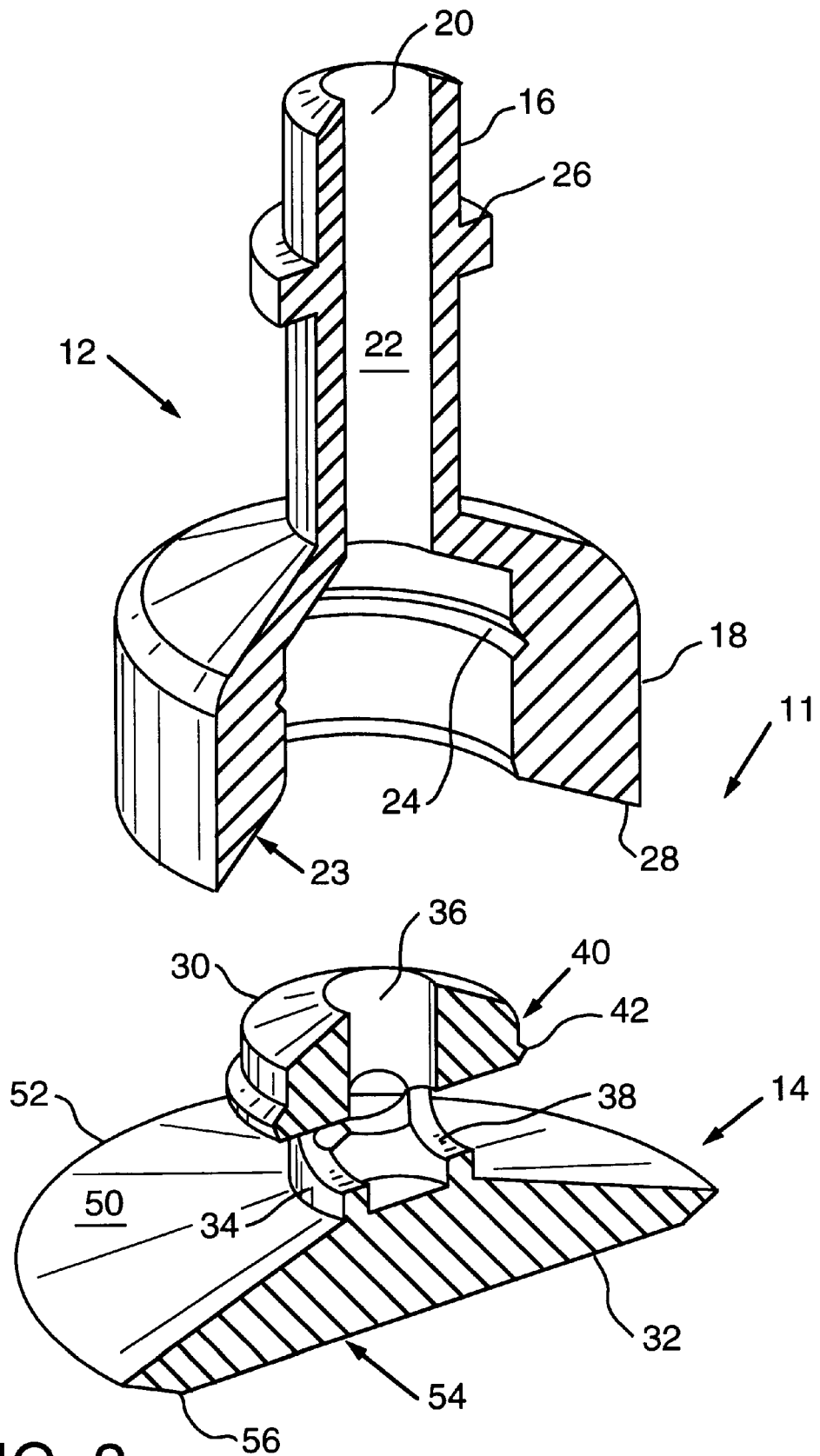
FIG. 2 is a cross sectional exploded perspective view of a preferred embodiment of the present invention along line 2—2.
Figure 3:
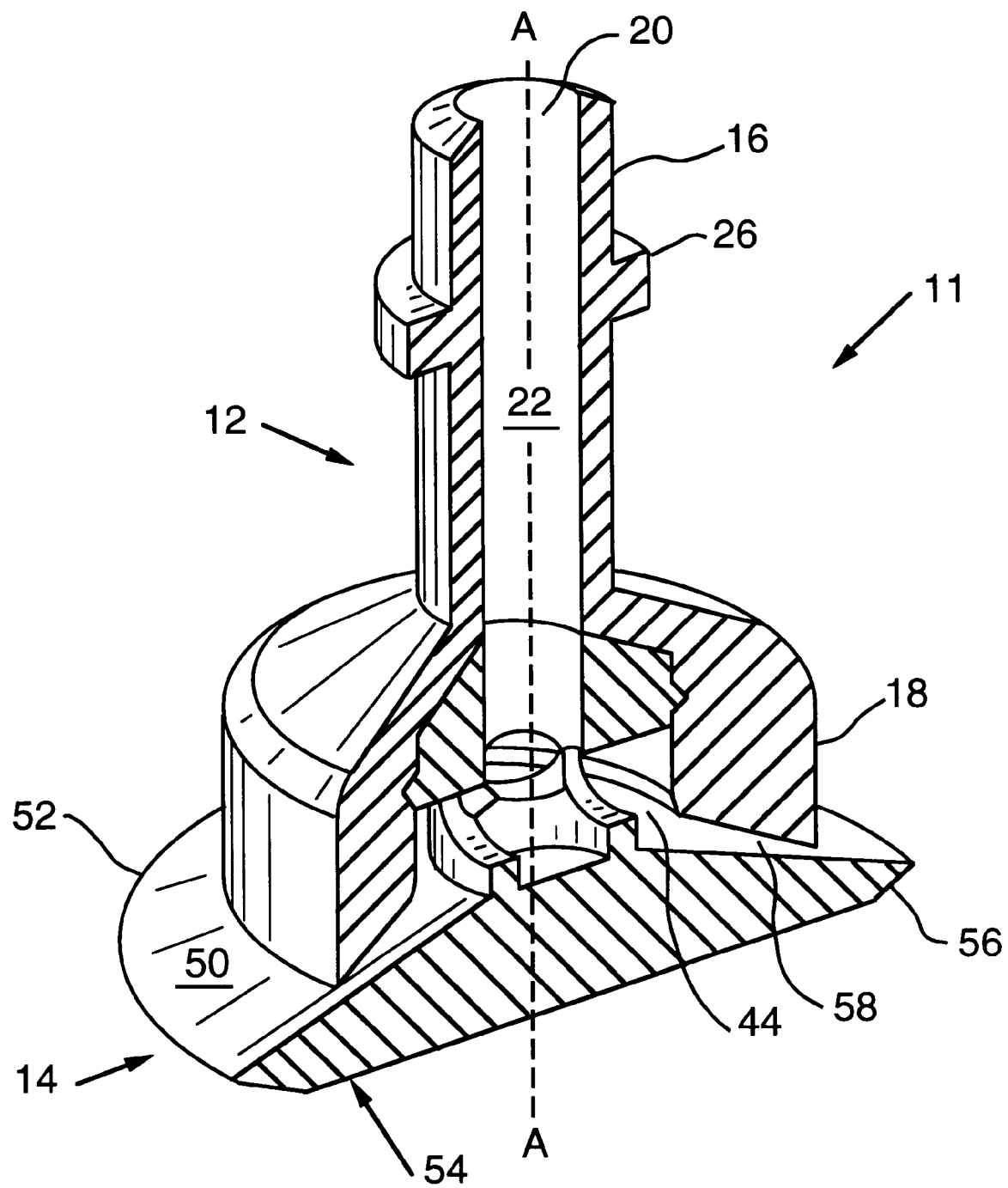
FIG. 3 is a cross sectional assembled perspective view of a preferred embodiment of the present invention along line 2—2.
Figure 4:
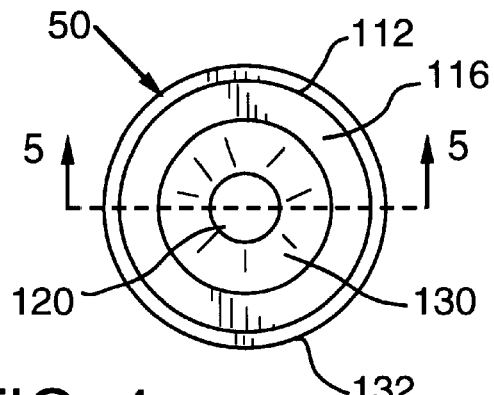
FIG. 4 is a top plan view of a second alternative embodiment of the apparatus.
Figure 5:
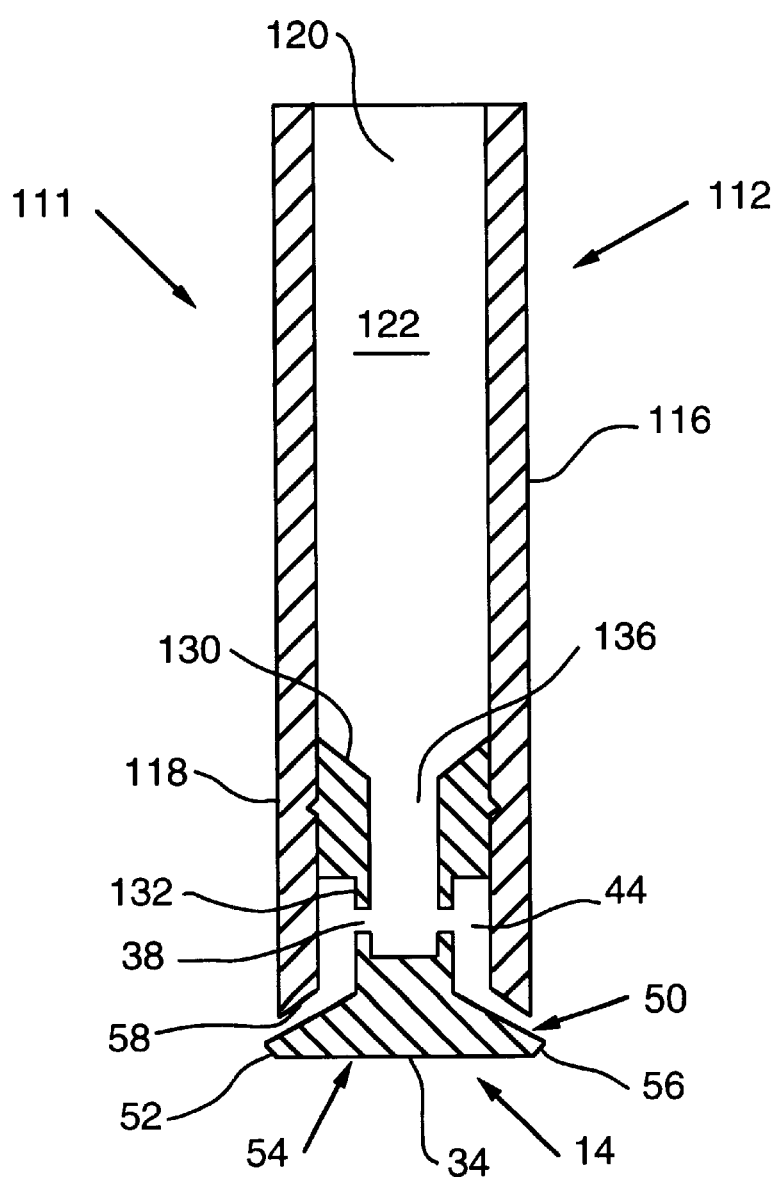
FIG. 5 is a side cross sectional assembled view of a first alternative embodiment of the present invention along line 5—5.

In a preferred embodiment, as shown in FIGS. 1–3, the nozzle 11 is axisymmetric about a longitudinal axis A—A. The housing 12 is bell shaped having a source portion 16 and a dispense portion 18 which are traversed by a central bore 20 defined by an inner surface 22 parallel to the longitudinal axis A—A. The central bore 20 has first and second diameters, respectively, corresponding to the source and dispense portions, 16 and 18, respectively. The second diameter of the central bore 20 is larger than the first diameter and abruptly changes between the source portion 16 and the dispense portion 18. The inner surface 22 of dispense portion 18 is also provided with a circumferential groove 24 for securing the insert 14 in the central bore 20 and the source portion 16 is provided with a flange 26 for attachment to a spin dispensing assembly. The dispense portion 18 has a dispense end 28 in which the inner surface 22 defining the bore 20 diverges at a second angle β with respect to the longitudinal axis A—A to form a dispense surface 23.

Also in a preferred embodiment, the insert 14 is generally circular shaped having first and second end sections, 30 and 32, respectively, separated by a middle section 34. The first section 30 has an outer surface 40 that conforms to the inner surface 22 of the housing 12 and includes a circumferential lip 42 that mates with the circumferential groove 24 in the housing to secure the insert 14 in substantial contact with the housing 12. The first section 30 prevents any substantial flow of liquid from occurring between the first section 30 and the inner surface 22. The insert 14 contains a fluid passage 36 extending between the first section 30 and a plurality of fluid ports 38 in the middle section 36 to provide fluid communication with the central bore 20 around the first section 30 of the insert 14. The fluid passage 36 is a centrally located second bore in the first section 30 and has the same diameter as the first diameter of the central bore 20 and is aligned with the central bore 20 to minimize the amount of turbulence generated in the flow by the transition. In one embodiment, the fluid passage 36 extends through the middle section 36 and past the fluid ports 38, terminating in the second section of the insert 14. The extension of the fluid passage 36 beyond the fluid ports 38 reduces the momentum of the process liquid perpendicular to the surface of the wafer, further lowering the impact velocity of the process liquid. However, the reduction in momentum is somewhat offset by the increased turbulence of the air surrounding the nozzle in this design.

The middle section 34 of the insert 14 has a diameter less than second diameter of the central bore 20 near the dispense portion 18 so that an annular region 44 is formed between the middle section 34 and the inner surface 22 of the housing 12. The fluid ports 38 are circumferentially oriented and distributed around the middle section 34 to fully distribute the flow in the annular region 44. A preferred embodiment incorporates circular fluid ports 38 because of the ease of manufacturing circular ports; however, the fluid ports 38 can be any shape necessary to accommodate the design. Although the ports 38 are preferably distributed uniformly around the circumference of the middle section 34, the skilled practitioner may distribute the ports to achieve other desired flow patterns in the nozzle 11.

Figure 12:
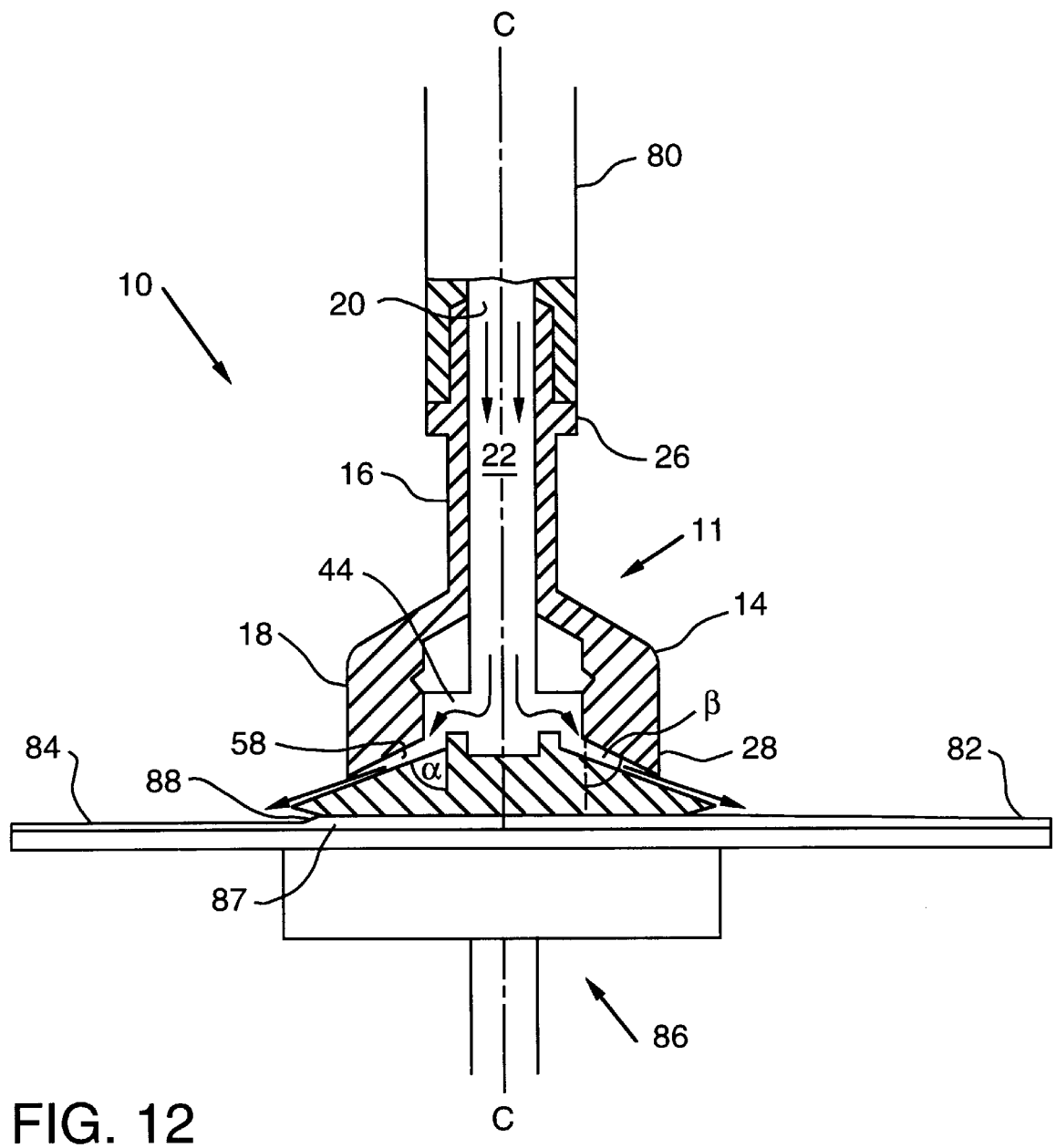

In a current preferred embodiment, the second section 52 of the insert 14 is a circular shaped disc having a diameter greater than the second diameter of the central bore 20. The second section 52 is attached at its center to the middle section 34 of the insert 14. The second section 32 extends beyond the dispense portion 18 and has a top flow surface 50 defined by an edge or perimeter 52 that has a diameter that is greater than the outer diameter of the housing 12. The top flow surface 50 forms a first angle α with the longitudinal axis A—A of the central bore 20 as measured from a portion of the longitudinal axis A—A extending through and opposite to the flow surface 50, so that process liquid dispensed onto the top flow surface 50 will be directed toward the edge or perimeter 52, as shown in FIG. 12. The first angle α can range from 0° to 180°; however, it is preferred that the angle be between 45° and 90° so that the major component of the flow direction is parallel to the wafer surface (i.e., perpendicular to the longitudinal axis A—A). It may alternatively be desirable in some instances to have the flow surface 50 be oriented at an angle between 90° and 180° to form a pool of process liquid within the nozzle, which would spill over the perimeter 52 onto the wafer surface.

The second section 32 also includes a bottom surface 54 defined by edge 52 that is generally perpendicular to the central bore 20. In a preferred embodiment, the bottom surface 54 has a beveled circumferential region 56 near the edge 52 that facilitates the creeping of the process liquid from the flow surface 50 around the edge 52 onto the bottom surface 54, which is beneficial when utilizing a meniscus to contact a portion of the surface of the wafer, as further discussed within.

The flow surface 50 of the insert 14 and the dispense end 28 are in close proximity and define a narrow fully circumferential (360°) flow path 58 along the flow surface 50. The continuous flow path 58 provides for a 360° flow of the process liquid on the flow surface 50 resulting in the dispensing of a continuous sheet of process liquid onto the wafer surface. Preferably, the second angle β is less than or equal to the first angle α, to provide the continuous flow path 58 with a converging or constant cross sectional flow area as defined by the flow surface 50 and the dispense surface 23. A converging or constant cross-sectional area is desirable to dampen any flow instability introduced upstream in the nozzle 11. The resistance to the flow of the process liquid through the nozzle 11 can be controlled by varying the size of the flow path 58 to produce a uniform flow field exiting the nozzle 11 either by varying the distance separating the flow surface 50 and the dispense surface 23 or the first and second angles, α and β, respectively. The impact velocity of the process liquid will be substantially reduced compared to prior art nozzles because the full perimeter 52 of the nozzle 11 is used to dispense the process liquid providing for a larger flow area and a corresponding lower fluid velocity. In addition, the fully circumferential flow path 58 allows for a continuous 360° sheet of process liquid to be dispensed from the perimeter 52 of the nozzle 11 in a circumferentially uniform manner, thereby overcoming the problems in the prior art with having to precisely align the nozzle 11 both radially and angularly to ensure that the liquid will contact the center of the wafer. Also, after the dispensing of the process liquid is completed, the fully circumferential flow path 58 retains the liquid remaining in the nozzle 11 and reduces the potential for the liquid to drip onto the surface compared to the multiple flow paths designs in the prior art.

Two alternative embodiments of the insert 114 are shown in FIGS. 4–8. In these embodiments, the source portion 116 and the dispense portion 118 have equal outer diameters providing for a fully cylindrical housing 112. Also, the first and second diameters of the central bore 120 are comparable. In one embodiment of the nozzle 111 shown in FIGS. 4 and 5, the first section 130 of the insert 114 is sized to conform to the inner surface 122 of the dispense portion 118 and the diameter of the fluid passage 136 in the first section 130 is smaller than the diameter of the central bore 120 and the first section 130 is shaped to channel process liquid into the fluid passage 136 from the central bore 120. In another embodiment of the nozzle 211, shown in FIGS. 6–8, the insert 214 is a solid member that is sized such that the flow passage 236 is defined by the annular gap 244 between the insert 214 and the inner surface 222 of the housing 212. The circumferential lip 242 is slotted to allow communication over the full length of the housing 212, as shown in FIG. 8. The embodiments 111 and 211 shown in FIGS. 4–8 provide a constant cross sectional area that provides for better air flow characteristics in the spin dispensing process chamber than the preferred embodiments shown in FIG. 1; however, the process liquid will be dispensed over a smaller area resulting in generally higher velocities when using the embodiments shown in FIG. 4–8.

Figure 9:
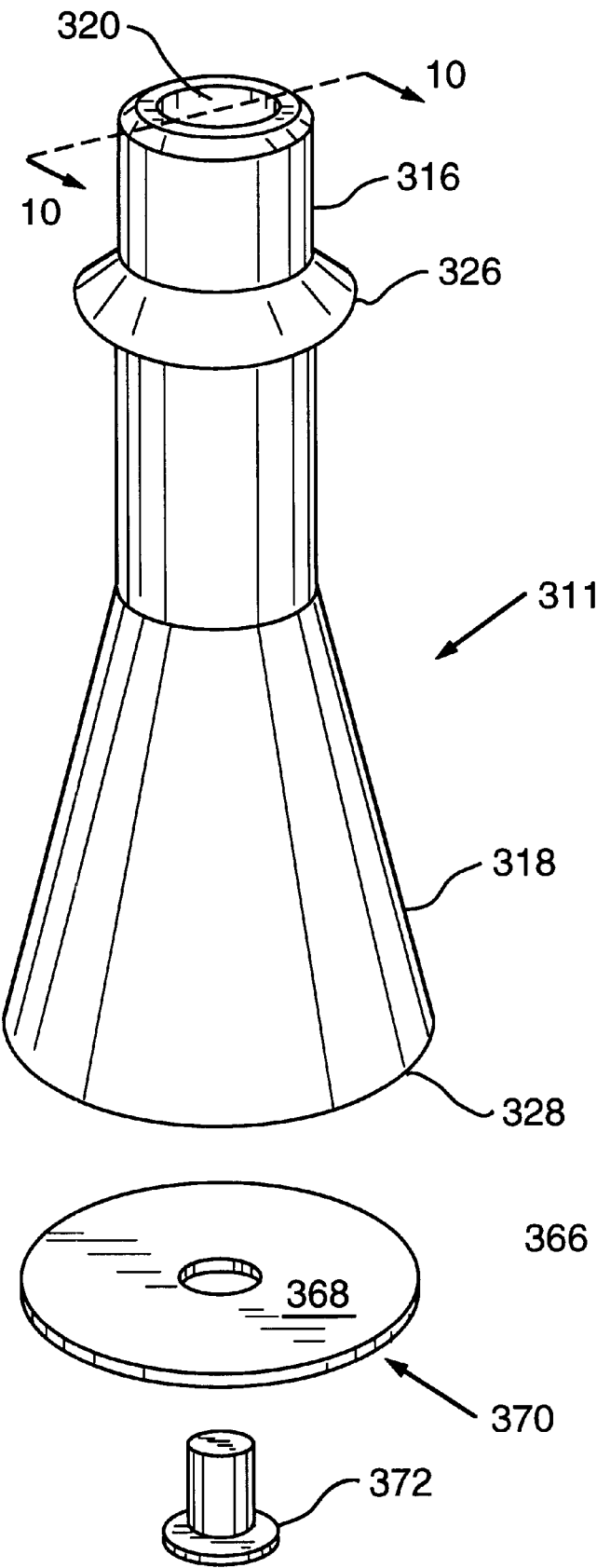
FIG. 9 is an exploded perspective view of a third alternative embodiment of the present invention.
Figure 10:
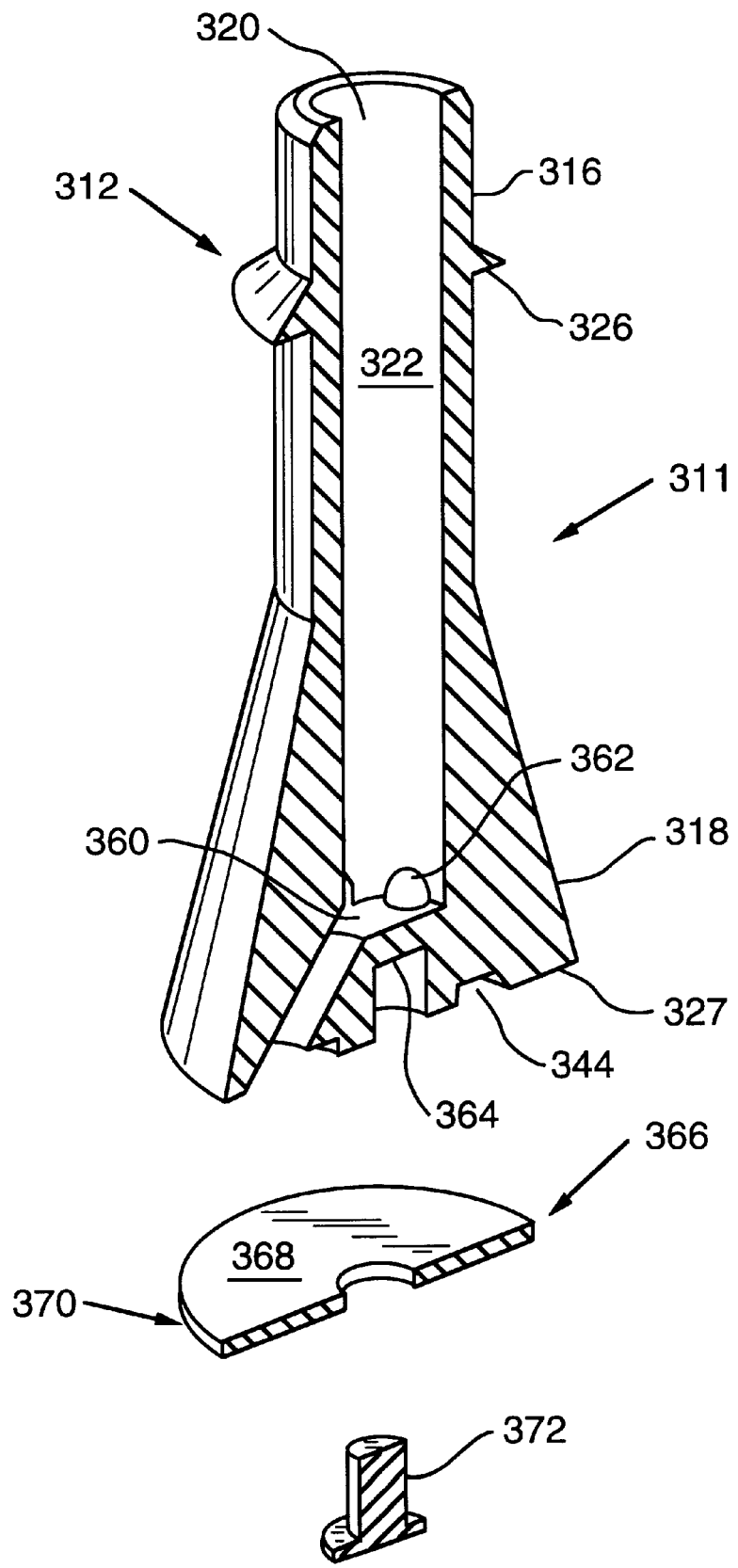
FIG. 10 is a cross sectional exploded perspective view of an alternative embodiment of the present invention along line 10—10.
Figure 11:
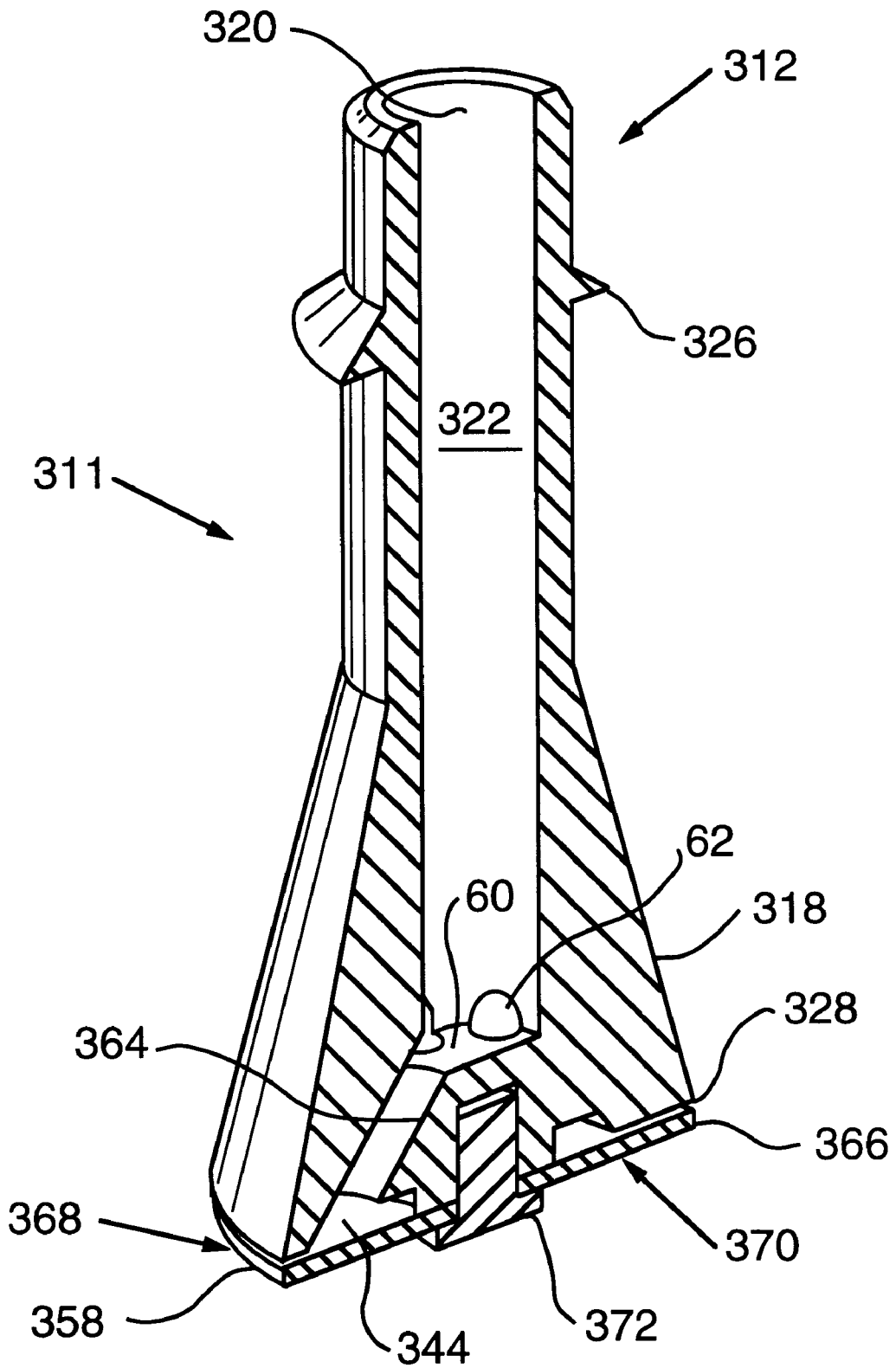
FIG. 11 is a cross sectional assembled perspective view of an alternative embodiment of the present invention along line 10—10; and, FIG. 12 is a cross sectional assembled perspective view of a preferred embodiment of the present invention along line 2—2 in a spin dispensing assembly.

In an alternative embodiment of the nozzle 311 shown in FIGS. 9–11, the dispense portion 318 has an increasing outer diameter from the source portion 316 toward the dispense end 328. The dispense portion 318 includes an integral distribution portion 360 extending across the central bore 320 and consisting of distribution ports 362 circumferentially distributed around a solid portion 364. The distribution ports 362 feed the annular plenum 344 at the dispense end 328. A distribution plate 366 having a top surface 368 and a bottom surface 370 is attached to the solid portion 364 by conventional methods, such as a pin 372, so that the top surface 368 and the dispense end 328 are in close proximity and define the fully circumferential continuous flow path 358 in fluid communication with the annular plenum 344.

A method and use of a preferred embodiment of the present invention will be described with respect to dispensing developer from a spin dispensing apparatus 10, as shown in FIG. 12. The source portion 16 of the nozzle 11 is attached using flange 26 to a liquid source 80, containing the process liquid to be dispensed, which in the present example is a developer solution. The liquid source 80 generally includes a liquid dispense arm that attaches to and positions the nozzle 11 in the spin dispensing apparatus 10 and the dispense arm is plumbed to provide the process liquid from a source, as is known in the art. A wafer 82 having a surface 84 to be coated is positioned on a support surface 85 of a rotatable chuck 86 that spins the wafer 82 around central axis C—C.

The nozzle 11 is positioned above the surface 84 of the wafer 82 and is radially offset from the center of wafer 82 so that the fully circumferential continuous sheet of developer solution emerging from the nozzle 11 contacts the center of the wafer 82. The chuck 86 is rotated for a period of time according to predetermined specifications. The developer solution is dispensed from the liquid source 80 into central bore 20 of the nozzle 11 in the source portion 16 and the developer solution flows through the central bore 20 and into the flow passage 36 in the first section 30 of the insert 14. The developer solution flows through the first section 30 into the middle section 34 via the fluid passage 36.

At this point, the flow turns to exit through ports 38 and a significant amount of the momentum of the developer solution in the direction parallel to the central bore 20 is lost in the form of an irrecoverable shock loss. The developer solution exits the fluid passage 36 through ports 38 into the annular region 44. The flow of the developer solution in the annular region 44 is generally turbulent as a result of the turning of the flow and the area change associated with passing through the ports 38. The developer solution passes through the annular region 44 contacting the flow surface 50 and enters the continuous flow path 58, which provides a high resistance path relative to the annular region 44. The narrow pathway provided by flow path 58 stabilizes the flow field by dampening the turbulence produced entering the annular region 44 and also circumferentially distributes the flow around the flow path 58.

The developer solution then uniformly exits the flow path 58 in a 360° continuous sheet flowing over the flow surface 50 off the edge or perimeter 52 in a 360° continuous circular sheet of developer solution onto the surface 84 of the wafer 82 forming a puddle 87. In a preferred method of dispensing the developer solution, the nozzle 11 is positioned in sufficiently close proximity to the surface 84 of the wafer 82 that the developer solution forms a meniscus 88 between the wafer surface 84 and the bottom surface 54 of the insert 14. In this way, full contact of the developer solution with the surface 84 near the center of the wafer 82 is better ensured. The beveled circumferential region 56 further provides for the developer solution to creep around the edge 52 onto the bottom surface 54 to provide a continuous source of developer solution to maintain the meniscus 88.

The nozzle of the present invention can also suitably modified to dispense process liquids at a wide range of flow rates by modifying the nozzle to have a variable flow area. The flow area can be varied by biasing the nozzle 11 such that the pressure of the impacting process liquid in the nozzle would bias the continuous flow path open to a greater extent, providing more flow area and thereby lowering the impact velocity of the process liquid. The biasing could be performed using conventional methods such as by incorporating a diaphragm or a spring load mechanism into the nozzle.

Those of ordinary skill in the art will appreciate that the present invention provides significant advantages over the prior art. In particular, the subject invention provides a more uniform and easily controlled dispensing of process liquids onto the surface of the semiconductor wafer, while lowering the potential for the formation of air bubbles in the resulting liquid layer formed on the surface by reducing the turbulence produced during the dispensing of the process liquid. While the subject invention provides these and other advantages over prior art, it will be understood, however, that various changes in the details, materials and arrangements of parts and steps which have been herein described and illustrated in order to explain the nature of the invention may be made by those skilled in the art within the principle and scope of the invention as expressed in the appended claims.

What is claimed is:

1. An apparatus for use in applying a process liquid to a semiconductor wafer surface from a liquid source comprising:

a nozzle having a bore with a longitudinal axis in fluid communication with the liquid source; and a disc-shaped flow surface having a smooth surface area extending to the perimeter thereof, the perimeter having a diameter equal or greater than that of said bore, said disc-shaped flow surface being adjacent to said bore to receive flow therefrom and oriented at a first angle relative to said axis to provide a substantially uniform flow of the process liquid off said perimeter and in fluid communication with said bore to provide a continuous flow path from said bore around said perimeter.

2. The apparatus of claim 1 wherein said perimeter is circular.

3. The apparatus of claim 2 wherein said first angle ranges between 0° and 90° relative to a portion of said axis extending through said flow surface.

4. The apparatus of claim 1 wherein said nozzle comprises:

a housing having a source portion connected to the liquid source and a dispense portion, and said bore traverses said source and dispense portions; and an insert having first and second sections, said first section being disposed in said bore in said dispense portion adjacent to said source portion and said second section being adjacent to said first section and including said flow surface, said flow surface being in close proximity to said dispense portion and said insert including at least one fluid passage providing fluid communication between said bore and said flow surface.

5. The apparatus of claim 4 wherein said fluid passage comprises an annular fluid passage between said insert and said housing.

6. The apparatus of claim 4 wherein said dispense portion has a dispense surface in close proximity to and opposing said flow surface, said dispense surface forming a second angle relative to said axis.

7. The apparatus of claim 6, wherein said dispense surface and said flow surface define a flow area through said flow path and said flow area does not diverge in the direction of said perimeter.

8. The apparatus of claim 7, wherein said fluid passage comprises a second bore passing through said first section.

9. The apparatus of claim 8, wherein said insert further comprises a middle section between said first and second sections disposed within said bore and having dimensions less than said bore so as to form an annular flow region in said bore surrounding said middle portion, said annular flow region being in fluid communication with said second bore and said flow surface.

10. The apparatus of claim 9, wherein:

said second bore extends into said middle portion; and, said middle portion contains a plurality of flow ports circumferential oriented connecting said annular flow region to said second bore.

11. The apparatus of claim 10 wherein:

said housing has an outer diameter proximate to said dispense portion; and, said second section of said insert extends beyond said housing and said flow surface has a diameter larger than said outer diameter.

12. The apparatus of claim 11 wherein said second section has a bottom surface defined by said perimeter opposite said flow surface and oriented perpendicular to said bore.

13. The apparatus of claim 12 wherein said bottom surface is beveled proximate to said perimeter.

14. The apparatus of claim 1 wherein said nozzle comprises:

a housing having a source portion connected to the liquid source and a dispense portion, and said bore traverses said source and dispense portions; and a distribution plate containing said flow surface, said flow surface being in close proximity to said dispense portion defining a flow path along said flow surface.

15. The apparatus of claim 14 wherein said housing further comprises a distribution portion spanning said bore adjacent to said dispense portion and containing a plurality of distribution ports providing fluid communication between said bore and said flow surface.

16. An apparatus for spin dispensing a process liquid onto a semiconductor wafer surface, comprising:

a liquid source;

a rotatable chuck having a wafer support surface; and a nozzle having a bore with a longitudinal axis in fluid communication with the liquid source, and a flow surface having a perimeter, the perimeter having a diameter greater than that of said bore, said flow surface having a smooth uniform surface area extending to the perimeter thereof and being oriented at a first angle relative to said axis and in fluid communication with said bore to dispense a uniform flow of process liquid onto said flow surface and around said perimeter directly onto the surface of a semiconductor wafer supported on said support surface.

17. The apparatus of claim 16, wherein said flow surface adjacent to said perimeter is substantially parallel to said support surface.

18. The apparatus of claim 16, wherein said flow surface is in close proximity to said support surface.

19. The apparatus of claim 16, wherein said first angle ranges from 0° to 90° relative to a portion of said axis extending through said flow surface.

20. The apparatus of claim 19, wherein said first angle ranges from 45° to 90°.

21. The apparatus of claim 16, wherein said nozzle comprises:

a housing having a source portion connected to the liquid source and a dispense portion, and said bore traverses said source and dispense portions; and, an insert having first and second sections, said first section being disposed in said bore in said dispense portion adjacent to said source portion and said second section being adjacent to said first section and containing said flow surface, said flow surface being in close proximity to said dispense portion and said insert including a fluid passage providing fluid communication between said bore and said flow surface.

22. The apparatus of claim 16, wherein said continuous flow path provides for substantially uniform cross sectional flow area between said flow surface and said dispense portion.

23. An apparatus for use in applying a process liquid to a semiconductor wafer surface from a liquid source comprising:

a nozzle having a bore with a longitudinal axis in fluid communication with the liquid source, said nozzle comprising a housing having a source portion connected to the liquid source and a dispense portion, said bore traversing said source and dispense portions; and a disc-shaped flow surface having a smooth surface area extending to the perimeter thereof, the perimeter having a diameter equal or greater than that of said housing, said disc-shaped flow surface being adjacent to said bore to receive flow therefrom and oriented at a first angle relative to said axis to provide a substantially uniform flow of the process liquid off said perimeter and in fluid communication with said bore to provide a continuous flow path from said bore around said perimeter.

24. An apparatus for use in applying a process liquid to a semiconductor wafer surface from a liquid source comprising:

a nozzle having a bore with a longitudinal axis in fluid communication with the liquid source; and a flow surface having a smooth surface area extending to the perimeter thereof, the perimeter having diameter equal or greater than that of said nozzle, said flow surface being adjacent to said bore to receive flow therefrom and oriented at a first angle relative to said axis to provide a substantially uniform flow of the process liquid off said perimeter and in fluid communication with said bore to provide a continuous flow path from said bore around said perimeter.

25. An apparatus for use in applying a process liquid to a semiconductor wafer surface from a liquid source comprising:

a nozzle having a bore with a longitudinal axis in fluid communication with the liquid source to receive a flow of process liquid therefrom and a bottom portion adjacent to a portion of said bore, said bottom portion shaped to decrease the velocity of a flow of the process liquid received from said bore; and a disc-shaped flow surface having a smooth surface area extending to the perimeter thereof, said flow surface being adjacent to said bore to receive flow therefrom and oriented at a first angle relative to said axis to provide a substantially uniform flow of the process liquid off said perimeter and in fluid communication with said bore to provide a continuous flow path from said bore around said perimeter.

* * * * *

UNITED STATES PATENT AND TRADEMARK OFFICE
CERTIFICATE OF CORRECTION

PATENT NO. : 5,954,877
DATED : September 21, 1999
INVENTOR(S) : Hayes

It is certified that error appears in the above-identified patent and that said Letters Patent is hereby corrected as shown below:

ON THE COVER PAGE:

[57] ABSTRACT

Line 1, delete "and a method"

Lines 19-25, delete "In the method of the invention, the nozzle is positioned to dispense a sheet of process liquid onto the wafer surface, while the surface is being rotated. The nozzle is radially offset from the center of the surface such that a portion of the continuous sheet of process liquid is dispensed directly onto the center of the wafer surface."

Signed and Sealed this

Twenty-second Day of May, 2001

*Attest:*

NICHOLAS P. GODICI

*Attesting Officer*    Acting Director of the United States Patent and Trademark Office